United States Patent
Zhu et al.

(10) Patent No.: US 12,520,430 B2
(45) Date of Patent: Jan. 6, 2026

(54) DISPLAY MODULE AND MOBILE TERMINAL

(71) Applicant: WUHAN CHINA STAR OPTOELECTRONICS SEMICONDUCTOR DISPLAY TECHNOLOGY CO., LTD., Hubei (CN)

(72) Inventors: Cuilin Zhu, Hubei (CN); Xiang Huang, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 637 days.

(21) Appl. No.: 17/795,543

(22) PCT Filed: Jun. 7, 2022

(86) PCT No.: PCT/CN2022/097363
§ 371 (c)(1),
(2) Date: Jul. 27, 2022

(87) PCT Pub. No.: WO2023/221194
PCT Pub. Date: Nov. 23, 2023

(65) Prior Publication Data
US 2023/0380069 A1    Nov. 23, 2023

(30) Foreign Application Priority Data
May 18, 2022 (CN) .......................... 202210550522.3

(51) Int. Cl.
*H05K 1/18* (2006.01)
*H05K 1/02* (2006.01)

(52) U.S. Cl.
CPC ........... *H05K 1/189* (2013.01); *H05K 1/0266* (2013.01); *H05K 2201/10128* (2013.01)

(58) Field of Classification Search
CPC ...... H05K 1/189; H05K 1/0266; H05K 1/118; H05K 2201/10128; H05K 2201/09381; H05K 2201/09918; H05K 2201/09418
See application file for complete search history.

(56) References Cited

U.S. PATENT DOCUMENTS

2015/0077948 A1*   3/2015   Kanno ................. H05K 1/0269
                                                        361/749
2019/0250447 A1    8/2019   Abe et al.
(Continued)

FOREIGN PATENT DOCUMENTS

CN        101419954 A     4/2009
CN        107422503 A    12/2017
(Continued)

OTHER PUBLICATIONS

International Search Report in International application No. PCT/CN2022/097363, mailed on Dec. 16, 2022.
(Continued)

*Primary Examiner* — Roshn K Varghese
(74) *Attorney, Agent, or Firm* — Rivka Friedman

(57) ABSTRACT

The present disclosure provides a display module and a mobile terminal. The display module includes a display panel and a flexible circuit board. The display panel includes a plurality of first binding terminals and a plurality of first alignment marks. The flexible circuit board includes a plurality of second binding terminals and a plurality of second alignment marks. The second binding terminals are bound to the first binding terminals, each of the first alignment marks corresponds to one of the second alignment marks, and each of a plurality of first marks of the first
(Continued)

alignment marks corresponds to one of a plurality of second marks of the second alignment marks.

18 Claims, 11 Drawing Sheets

(56) References Cited

U.S. PATENT DOCUMENTS

| | | | | |
|---|---|---|---|---|
| 2021/0351262 | A1* | 11/2021 | Kim | H10K 59/88 |
| 2022/0013620 | A1* | 1/2022 | Kim | H10K 59/1213 |

FOREIGN PATENT DOCUMENTS

| | | |
|---|---|---|
| CN | 107658234 A | 2/2018 |
| CN | 109426040 A | 3/2019 |
| CN | 111081151 A | 4/2020 |
| CN | 111343789 A | 6/2020 |
| CN | 113257126 A | 8/2021 |
| CN | 113380865 A | 9/2021 |
| CN | 113433737 A | 9/2021 |
| CN | 113707700 A | 11/2021 |
| CN | 114241922 A | 3/2022 |
| CN | 114389064 A | 4/2022 |
| JP | 2004128324 A | 4/2004 |
| JP | 2012013719 A | 1/2012 |

OTHER PUBLICATIONS

Written Opinion of the International Search Authority in International application No. PCT/CN2022/097363, mailed on Dec. 16, 2022.

Chinese Office Action issued in corresponding Chinese Patent Application No. 202210550522.3 dated Jan. 19, 2023, pp. 1-10.

* cited by examiner

DISPLAY MODULE AND MOBILE TERMINAL

TECHNICAL FIELD

The present disclosure relates to a display technical field, and more particularly to a display module and a mobile terminal.

BACKGROUND

In an existing flexible display panel, a flexible circuit board is typically bound to a binding region of the display panel for the transmission of data signals. There are two T-shaped alignment marks on both sides of the existing flexible circuit board, and only one T-shaped alignment mark is provided in the binding region of the display panel. The T-shaped alignment mark causes a small alignment area and a large level difference, and alignment conditions under a high temperature and a high pressure cause a technical problem such as cracks in the vicinity of the alignment marks on the panel due to an uneven stress.

Technical Problems

The present disclosure provides a display module and a mobile terminal to solve a technical problem that a crack occurs when the existing display panel is bound to the flexible circuit board.

Technical Solutions to the Problems

The present disclosure provides a display module comprising:
- a display panel comprising a plurality of first binding terminals and a plurality of first alignment marks located at periphery of the plurality of first binding terminals; and
- a flexible circuit board comprising a plurality of second binding terminals and a plurality of second alignment marks located at periphery of the plurality of second binding terminals, wherein the plurality of second binding terminals are bound to the plurality of first binding terminals, each of the first alignment marks corresponds to one of the second alignment marks, and the number of the first alignment marks is equal to the number of the second alignment marks;
- wherein, each of the first alignment marks comprises a plurality of first marks, each of the second alignment marks comprises a plurality of second marks, each of the first marks corresponds to one of the second marks, the plurality of first marks comprise a first alignment portion and a first support portion, and the first alignment portion is located between the first support portion and the plurality of first binding terminals;
- wherein, the plurality of second marks comprise a second alignment portion and a second support portion, and the second alignment portion is located between the second support portion and the plurality of second binding terminals; and
- wherein the first support portion and the second support portion are aligned and fitted to each other, and the first alignment portion and the second alignment portion are aligned and fitted to each other.

An embodiment of the present disclosure further provides a mobile terminal comprising a terminal body and a display module, wherein the display module and the terminal body are combined integrally; wherein the display module comprises:
- a display panel comprising a plurality of first binding terminals and a plurality of first alignment marks located at periphery of the plurality of first binding terminals; and
- a flexible circuit board comprising a plurality of second binding terminals bound to the first binding terminals and a plurality of second alignment marks located at periphery of the plurality of second binding terminals, wherein the first alignment marks correspond to the second alignment marks, and the number of the first alignment marks is equal to the number of the second alignment marks;
- wherein, each of the first alignment marks comprises a plurality of first marks, each of the second alignment marks comprises a plurality of second marks, each of the first marks corresponds to one of the second marks, the plurality of first marks comprise a first alignment portion and a first support portion, and the first alignment portion is located between the first support portion and the plurality of first binding terminals;
- wherein, the plurality of second marks comprise a second alignment portion and a second support portion, and the second alignment portion is located between the second support portion and the plurality of second binding terminals; and
- wherein the first support portion and the second support portion are aligned and fitted to each other, and the first alignment portion and the second alignment portion are aligned and fitted to each other.

Beneficial Effects

Embodiments of the present disclosure increase an alignment area of the alignment marks in the display panel and the flexible circuit board by providing the same number of alignment marks in the display panel as in the flexible circuit board while the first alignment marks in the display panel and the second alignment marks in the flexible circuit board are each constituted by a plurality of marks, thereby avoiding the problem of an uneven force due to the small number of alignment marks and the small alignment area, and improving the alignment stability of the display panel and the flexible circuit board.

EMBODIMENTS OF THE PRESENT DISCLOSURE

To make the objectives, technical solutions, and effects of the present disclosure clearer and more definite, the present disclosure is described in detail below by referring to the accompanying drawings and the embodiments. It should be understood that the specific embodiments described herein are only used to explain the present disclosure, and are not used to limit the present disclosure.

The existing flexible circuit board and the display panel have different number of alignment marks, and the alignment marks of the T-shape causes a small alignment area and a large level difference, which result in a technical problem such as cracks in the vicinity of the alignment marks on the panel due to an uneven stress. Therefore, the present disclosure provides a display module to solve the above technical problem.

Figure 1:
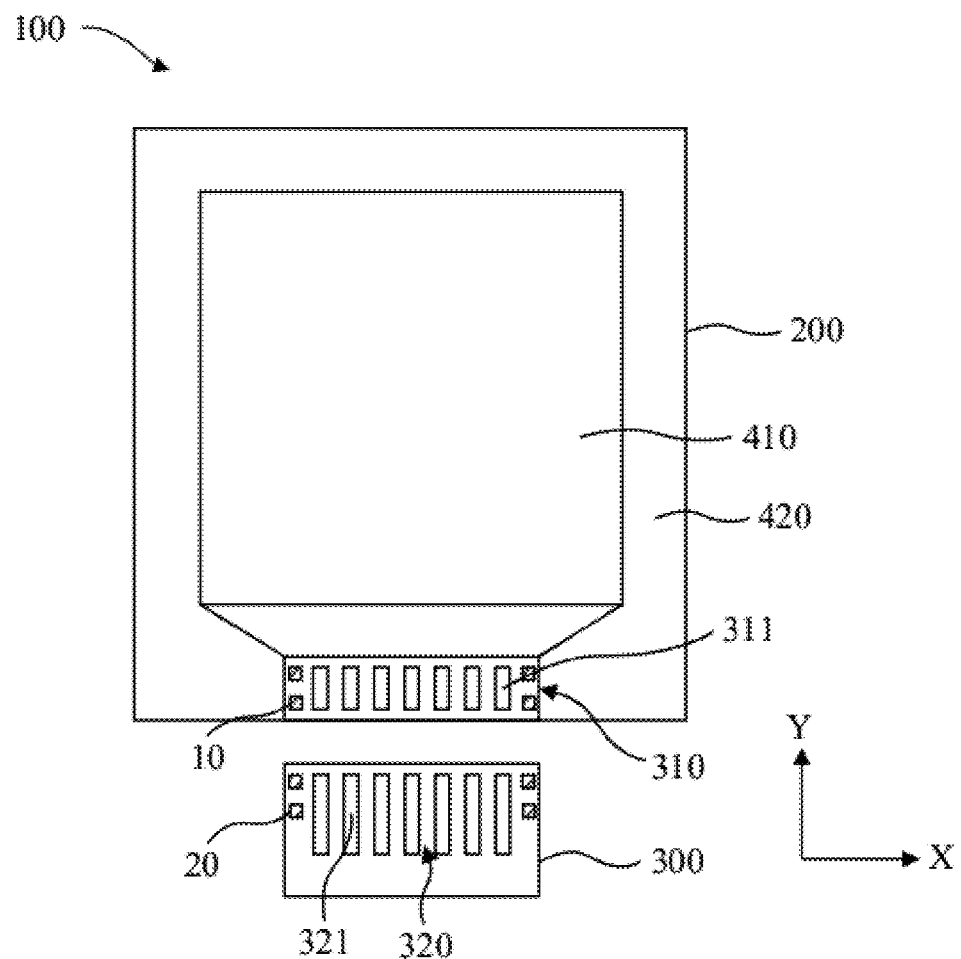
FIG. 1 is a schematic structural diagram of a display module according to an embodiment of the present disclosure.

Referring to FIG. 1, an embodiment of the present disclosure provides a display module 100 including a display panel 200 and a flexible circuit board 300, where the flexible circuit board 300 is bound to the display panel 200.

In the embodiment, the display panel 200 may include a plurality of first binding terminals 311 and a plurality of first alignment marks 10 located at periphery of the plurality of first binding terminals 311, and the flexible circuit board 300 may include a plurality of second binding terminals 321 and a plurality of second alignment marks 20 located at periphery of the plurality of second binding terminals 321.

In the embodiment, the second binding terminals 321 are bound to the first binding terminals 311, the first alignment marks 10 correspond to the second alignment marks 20, and the number of the first alignment marks 10 is equal to the number of the second alignment marks 20.

In the embodiment, the first alignment mark 10 includes a plurality of first marks, the second alignment mark 20 includes a plurality of second marks, and each of the first marks corresponds to one of the second marks.

The embodiment of the present disclosure increases alignment area of the alignment marks in the display panel 200 and the flexible circuit board 300 by providing the same number of alignment marks in the display panel 200 as in the flexible circuit board 300 while the first alignment marks 10 in the display panel 200 and the second alignment marks 20 in the flexible circuit board 300 are each constituted by a plurality of marks, thereby avoiding the problem of an uneven force due to the small number of alignment marks and the small alignment area, and improving the alignment stability of the display panel 200 and the flexible circuit board 300.

In the display module 100 of the embodiment of the present disclosure, the plurality of first marks may include a first alignment portion 190 and a first support portion 130, and the first alignment portion 190 is located between the first support portion 130 and the plurality of first binding terminals 311; and the plurality of second marks include a second alignment portion 290 and a second support portion 230, and the second alignment portion 290 is located between the second support portion 230 and the plurality of second binding terminals 321.

In the embodiment, the first support portion 130 and the second support portion 230 are aligned and fitted to each other, and the first alignment portion 190 and the second alignment portion 290 are aligned and fitted to each other.

In the embodiment, each of the first alignment marks 10 may include a first alignment portion 190 and a first support portion 130, and the first support portion 130 may be constituted by the first marks; each of the second alignment marks 20 may include a second alignment portion 290 and a second support portion 230, and the second support portion 230 may be constituted by a second marks; and the first support portion 130 is mainly used for being aligned to and supporting the corresponding second support portion 230 to protect an inner alignment portion.

It should be noted that, as shown in FIGS. 2a to 6c, a plurality of first marks are arranged in a first direction X, each of the first marks is extended in a second direction Y, and two adjacent first marks are arranged at intervals; and a plurality of second marks are arranged in the first direction X, each of the second marks is extended in a second direction Y, and two adjacent second marks are arranged at intervals.

It should be noted that the first alignment portion 190 may be constituted by at least two first marks. The larger the number of first marks constituting the first alignment portion 190 is, the more complicated a pattern of the first alignment portion 190 is, and the higher the identification accuracy is. The first support portion 130 may be constituted by at least one first marks. The larger the number of first marks constituting the first support portion 130 is, the larger a support force that the first support portion 130 can bear is. Similarly, the second alignment portion 290 is similar to the first alignment portion 190, and the second support portion 230 is similar to the first support portion 130, and thus the second alignment portion 290 the second support portion 230 are not described repeatedly herein.

In the embodiments of the present disclosure, for brief description of the technical solutions, the first alignment portion 190 of the embodiment of the present disclosure may be constituted by two first marks, and the first support portion 130 may be constituted by one first mark; and the second alignment portion 290 may be constituted by two second marks, and the second support portion 230 may be constituted by one second mark.

It should be noted that different first marks constitute different functional portions, for example, an alignment portion and a support portion, so that different first marks may have different shapes, which may have two sub-marks. Likewise, the different second marks may also have different shapes.

Technical solutions of the present disclosure will be described now in conjunction with specific embodiments of the present disclosure.

In the embodiment, referring to FIG. 1, the display panel 200 may include a display region 410 and a non-display region 420 located at the periphery of the display region 410. A first binding region 310 is disposed in the non-display region 420. A plurality of power lines of the display panel 200 may be extended from the display region 410 to the non-display region 420. For example, data lines disposed longitudinally or the like are extended from the display region 410 to the first binding region 310, and are connected to a plurality of first binding terminals 311 in the first binding region 310.

In the embodiment, referring to FIG. 1, the flexible circuit board 300 may include a second binding region 320 corresponding to the first binding region 310. The second binding region 320 is provided with a plurality of second binding terminals 321, and each of the second binding terminals 321 is aligned and connected to one of the first binding terminals 311.

In the embodiment, a plurality of first binding terminals 311 or a plurality of second binding terminals 321 are arranged in the first direction X. In the embodiment, since the number of the first binding terminals 311 and the second binding terminals 321 is larger and the pitch and size of the terminals are smaller, there may be problems such as alignment deviation in aligning the terminals. The existing display panel 200 and the flexible circuit board 300 are generally provided with alignment marks, that is, the alignment connection of the binding terminals can be realized by the alignment of the alignment marks on the display panel 200 and the flexible circuit board 300. However, the alignment marks of the existing display panel 200 and the flexible circuit board 300 are generally designed to be T-shaped, and the alignment areas of the two T-shaped alignment marks are relatively small. At the same time, the difference in the number of the alignment marks causes technical problem such as cracks due to an unevenness stress in aligning and bonding the alignment marks.

In the embodiment, a plurality of first alignment marks 10 are generally disposed on both sides of the plurality of first binding terminals 311 due to the space limitation of the wiring. For example, as shown in FIG. 1, the display panel 200 may include four first alignment marks 10. The four first alignment marks 10 may be disposed adjacent to top corners of the plurality of first binding terminals 311, and the four first alignment marks 10 on the both sides are symmetrically disposed along a center line of the plurality of first binding terminals 311 in the second direction Y. Similarly, since the number and position of the second alignment marks 20 need to match the number and position of the first alignment marks 10, four second alignment marks 20 are also provided on the flexible circuit board 300. The four second alignment marks 20 may be disposed immediately adjacent to top corners of the plurality of second binding terminals 321, and the four second alignment marks 20 on the left and right sides are symmetrically disposed along the center line of the plurality of second binding terminals 321 in the second direction Y.

In the embodiment, the second direction Y is perpendicular to the first direction X.

The number of the alignment marks is not limited in the embodiment, and may be two or more, as long as the number of the alignment marks on the display panel 200 is equal to the number of the alignment marks on the flexible circuit board 300.

In the display module 100 of the embodiment of the present disclosure, referring to FIGS. 2a to 4c, on the display panel 200, the first alignment portion 190 of the first alignment mark 10 may include a first stem mark 110 and a first branch mark 120, and the first stem mark 110 and the first branch mark 120 may be juxtaposed in the first direction X. On the flexible circuit board 300, the second alignment portion 290 of the second alignment mark 20 may include a second stem mark 210 and a second branch mark 220, and the second stem mark 210 and the second branch mark 220 may be juxtaposed in the first direction X.

In the embodiment, the first stem mark 110 corresponds to the second stem mark 210, and the first branch mark 120 corresponds to the second branch mark 220. That is, the first stem mark 110 is aligned to the second stem mark 210, and the first branch mark 120 is aligned to the second branch mark 220.

In the embodiment, the first alignment portion 190 further includes at least one first extension segment 140 extending toward the first branch mark 120, and the second alignment portion 290 further includes at least one second extension segment 240 extending toward the second branch mark 220, where an area of the first extension segment 140 is different from an area of the second extension segment 240.

Referring to FIGS. 2a to 6c, the first extension segment 140 and the second extension segment 240 may or may not be connected to the corresponding branch marks. A pattern of the first alignment portion 190 and a pattern of the second alignment portion 290 increase the alignment area of the first alignment mark 10 and the second alignment mark 20, thereby avoiding the problem of the uneven stress due to the small alignment area of the alignment marks, and improving the alignment stability of the display panel 200 and the flexible circuit board 300.

In the configurations of FIGS. 3a to 6c, on the display panel 200, the first support portion 130 is arranged along a first direction X. The first support portion 130 and the first stem mark 110 are symmetrically disposed with respect to the center line of the first branch mark 120, and the first alignment mark 10 may be constituted by the first stem mark 110, the first branch mark 120, the first extension segment 140, and the first support portion 130, i.e., the first alignment mark may be constituted by three longitudinal marks and at least one lateral mark. For the first support portion 130 in FIG. 2a, it may include two first sub-support portions 131 that are separately disposed.

In the configurations of FIGS. 2a to 6c, on the flexible circuit board 300, the second support portion 230 is arranged in the first direction X. The second support portion 230 and the second stem mark 210 are symmetrically disposed with respect to the center line of the second branch mark 220, and the second alignment mark 20 may be constituted by the second stem mark 210, the second branch mark 220, the second extension segment 240, and the second support portion 230, i.e., the second alignment mark 20 may be constituted by three longitudinal marks and at least one lateral mark.

In the embodiment, the alignment and support of the first support portion 130 and the second support portion 230 reduce an alignment pressure between the first alignment portion 190 and the second alignment portion 290, thereby preventing the diffusion of an adhesive layer to both sides of the alignment portion due to the excessive alignment pressure between the first alignment portion 190 and the second alignment portion 290. Secondly, the arrangement of the first support portion 130 and the second support portion 230 reduces the ratio of the area of the blank regions on both sides of the alignment portion, thereby avoiding the technical problem of the uneven force when the display panel 200 is aligned to the flexible circuit board 300. Finally, the complex patterns of the support portion and the alignment portion can also improve an identification accuracy and an alignment fault tolerance rate of the alignment marks.

In the present embodiment, in order to increase complexity of the patterns of the first alignment mark 10, at least two first marks are separately disposed. For example, the first support portion 130 in the configurations of FIGS. 2a to 6c are each separately disposed from the corresponding first stem mark 110 and the first branch mark 120, and the second support portion 230 may be separately disposed from the corresponding first stem mark 210 and the first branch mark 220. However, since the plurality of second marks are formed by copper plating on the substrate and if the number of separated marks in the second alignment mark 20 is too many, which will cause the separated marks to be detached from the substrate of the flexible circuit board 300, the plurality of second marks may be provided continuously, which is not specifically limited in the present disclosure.

In the embodiment, a pattern of the first alignment portion 190 and a pattern of the second alignment portion 290 may be configured to be the same or different. The pattern of the first alignment portion 190 and the pattern of the second alignment portion 290 may be different, so that the identification accuracy and the alignment fault tolerance rate of the alignment marks can be increased. For example, the patterns of the first alignment portions 190 and second alignment portions 290 in FIGS. 2a to 4c may be different, and the patterns of the first and second alignment portions 190 and 290 in FIGS. 5a to 6c may be the same.

In the embodiment, the area of the first extension segment 140 may be smaller than the area of the second extension segment 240 for the patterns of the first and second alignment portions 190 and 290 in FIGS. 2a to 4c.

In the embodiment, the first extension segment 140 is the configuration of the alignment mark on the display panel 200, and in the alignment criterion, in order to ensure the accuracy of the alignment, the size of the alignment marks on the display panel 200 needs to be larger than the size of the alignment marks on the flexible circuit board 300. The alignment marks on the flexible circuit board 300 are formed by copper plating on the substrate and if the number of separated marks in the second alignment mark 20 is too many, which will cause the separated marks to be detached from the substrate of the flexible circuit board 300, so that continuous alignment marks are provided as many as possible among the second alignment mark 20. The alignment marks of the display panel 200 are formed by a film forming process of the multi-layer metal layer in the array layer, so the adhesion of the display panel 200 to the substrate is more stable than that of the flexible circuit board 300 and can be not easily detached.

Figure 2A:
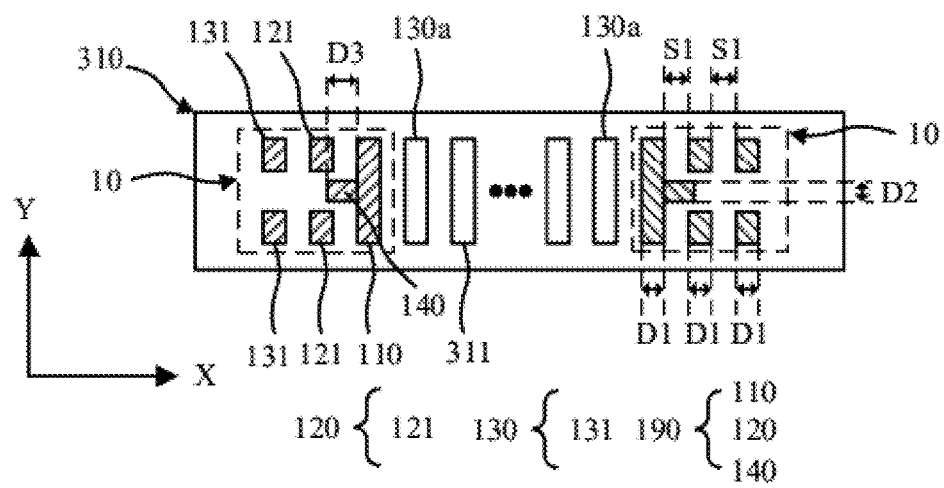
FIG. 2a is a first configuration of a first binding region in a display panel according to an embodiment of the present disclosure.
Figure 2B:
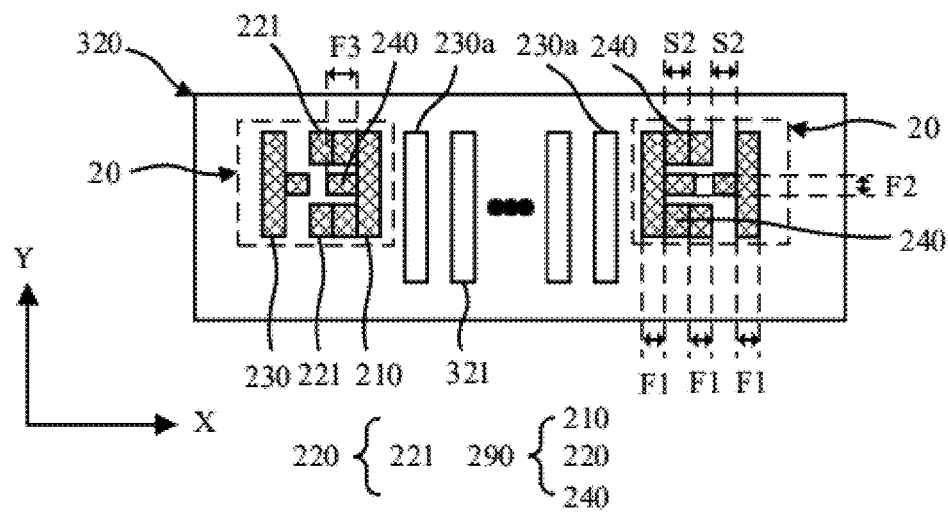
FIG. 2b is a first configuration of a second binding region in a flexible circuit board according to an embodiment of the present disclosure.
Figure 2C:
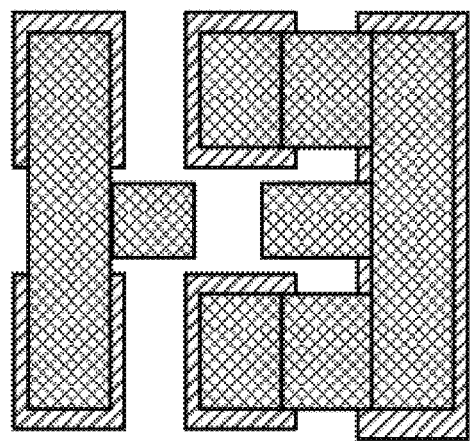
FIG. 2c is a diagram showing a first stack of first and second alignment marks in a display module according to an embodiment of the present disclosure.

In the display module 100 of the embodiment of the present disclosure, referring to FIGS. 2a to 2c, in the first alignment mark 10, the first branch mark 120 may include separately disposed two first sub-branch marks 121, the first extension segment 140 is extended toward a region between the two first sub-branch marks 121, and the first extension segment 140 may be separately disposed from the first branch mark 120.

In the embodiment, in the first alignment mark 10, the first support portion 130 may include separately disposed two first sub-support portions 131, the two first sub-support portions 131 are disposed opposite to the two first sub-branch marks 121, and the shapes and sizes of the two first sub-support portions 131 may be the same.

In the embodiment, an extension length of the first extension segment 140 in the first direction X may be equal to a size of the first stem mark 110 in the first direction X.

In the embodiment, the size D2 of the first extension segment 140 in the second direction Y may be the same as the extension length D3 of the first extension segment 140 in the first direction X. That is, the first extension segment 140 may be a convex square, which facilitates the identification of an alignment mark identification machine.

In the embodiment, the values of D2 and D3 may be greater than or equal to 80 microns. For example, the values of D2 and D3 in the present disclosure may be 90 microns to 100 microns.

In the embodiment, referring to FIGS. 2a-2c, in the second alignment mark 20, the second branch mark 220 may include separately disposed two second sub-branch marks 221, and the second alignment mark 20 includes three second extension segments 240 extending toward the second branch mark 220. The second extension segment 240 in the middle of the three second extension segments 240 is aligned to the first extension segment 140, and is extended toward a region between the two second sub-branch marks 221. The two second extension segments 240 on both sides of the three second extension segments 240 are extended toward the corresponding second sub-branch mark 221, and are connected to the corresponding second sub-branch mark 221. The sizes of the two second extension segments 240 on both sides of the three second extension segments 240 in the second direction Y are equal to the size of the corresponding second sub-branch mark 221 in the second direction Y, that is, the two second sub-branch marks 221 are extended toward the second stem mark 210 as a whole.

In the embodiment, the size F2 of the middle second extension segment 240 in the second direction Y may be the same as the extension length F3 of the second extension segments 240 in the first direction X, that is, the second extension segment 240 may be a convex square. The values of F2 and F3 may be the same as the corresponding D2 and D3, and the second extension segment 240 may be integrally retracted 5 μm with respect to the first extension segment 140.

In the embodiment, referring to FIGS. 2a-2c, in the second alignment mark 20, the second support portion 230 and the second stem mark 210 are symmetrically disposed with respect to the center line of the second branch mark 220 in the second direction Y, and an extension segment extending toward the second branch mark 220 is further disposed on the second support portion 230, and the extension segment and the intermediate second extension segment 240 are symmetrically disposed with respect to the center line of the second branch mark 220 in the second direction Y.

In the embodiment of FIGS. 2a-2c, for the first alignment mark 10, the first extension segment 140, the separately disposed two first sub-branch marks 121, and the separately disposed two first sub-support portions 131 increase the complexity of the pattern of the first alignment mark 10 to facilitate the identification of an alignment mark identification machine. For the second alignment mark 20, the arrangement of the plurality of second extension segments 240 and the extension segments increases the continuity of the second alignment marks 20, improves the stability of each of the second alignment marks 20, and prevents each of the second alignment marks 20 from detaching from the substrate.

In the embodiment, referring to FIGS. 2a-2c, an orthographic projection of a portion of the second marks on the first marks is within the first marks. In order to ensure the accuracy of the alignment, the size of the alignment marks on the display panel 200 needs to be larger than the size of the alignment marks on the flexible circuit board 300.

In the embodiment, the first stem mark 110 and the second stem mark 210 are taken as an example. The size D1 of the first stem mark 110 in the first direction X may be 60 microns to 120 microns, and the size F1 of the second stem mark 210 in the first direction X may be integrally retracted 5 microns with respect to D1. Therefore, it can be seen that the second stem mark 210 falls within the first stem mark 110 when the first stem mark 110 is aligned to the second stem mark 210. Similarly, when the first alignment mark 10 is aligned to the second stem mark 210, since the first branch mark 120 is constituted by two first sub-branch marks 121 and the first support portion 130 is constituted by two first sub-support portions 131, the second branch mark 220 falls within a portion of the first branch marks 120 and the second support portion 230 falls within a portion of the first support portion 130.

In the embodiment, all of the first stem mark 110, the first branch mark 120, and the first support portion 130 are the first marks, and a first pitch S1 of the two adjacent first marks may be 50 microns to 80 microns. All of the second stem mark 210, the second branch mark 220, and the second support portion 230 are the second marks, and a second pitch S2 of the two adjacent second marks is larger than the first pitch S1.

In the embodiment, a difference between the first pitch S1 and the second pitch S2 may be 9 to 11 microns.

In the display module 100 of the embodiment of the present disclosure, referring to FIGS. 3a to 4c, in the first alignment mark 10, the first branch mark 120 includes separately disposed two first sub-branch marks 121, the first stem mark 110 is connected to one of the two first sub-branch marks 121 by the first extension segment 140, and the first stem mark 110 is separately disposed from another of the two first sub-branch marks 121.

In the display module 100 of the embodiment of the present disclosure, referring to FIGS. 3a to 4c, in the second alignment mark 20, the second branch mark 220 includes separately disposed two second sub-branch marks 221, and the second stem mark 210 is connected to the two first sub-branch marks 221 by the two extension segments 240. The size of one of the two second extension segments 240 in the second direction Y is equal to the size of the second stem mark 210 in the first direction X, the size of another of the two second extension segments 240 in the second direction Y is equal to the size of the corresponding second sub-branch mark 221 in the second direction Y, and the first direction X is perpendicular to the second direction Y.

The two first sub-branch marks 121 in FIGS. 3a to 4c have different lengths compared to the configuration of FIGS. 2a-2c, while the first extension segment 140 is connected to the longer sub-branch mark of the two first sub-branch marks 121. Next, the two second sub-branch marks 221 in FIGS. 3a to 4c have different lengths, while one of the two second extension segments 240 is connected to the longer sub-branch mark of the two first sub-branch marks 121, another of the two second extension segments 240 is connected to the shorter sub-branch mark of the two first sub-branch marks 121, and the size of the shorter sub-branch mark 221 in the second direction Y is the same as the size of the corresponding second extension segment 240 in the second direction Y.

In the configurations of FIGS. 2a to 4c, the first support portion 130 in FIGS. 2a-2c is constituted by two separately disposed first sub-support portions 131, and the first support portion 130 in FIGS. 3a to 4c does not include the separately disposed first sub-support portions. Next, in FIGS. 2a-2c, the first support portion 130 and the first stem mark 110 are asymmetrically disposed with respect to the center line of the first branch mark 120 in the second direction Y, while in FIGS. 3a to 4c, the first support portion 130 and the first stem mark 110 are symmetrically disposed with respect to the center line of the first branch mark 120 in the second direction Y, and the second support portion 230 and the second stem mark 210 are symmetrically disposed with respect to the center line of the second branch mark 220 in the second direction Y.

Figure 3A:
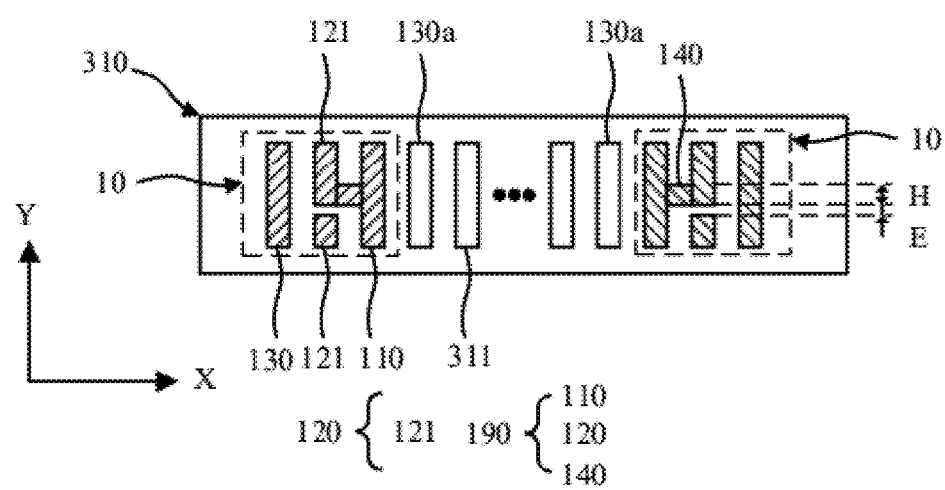
FIG. 3a is a second configuration of a first binding region in a display panel according to an embodiment of the present disclosure.
Figure 3B:
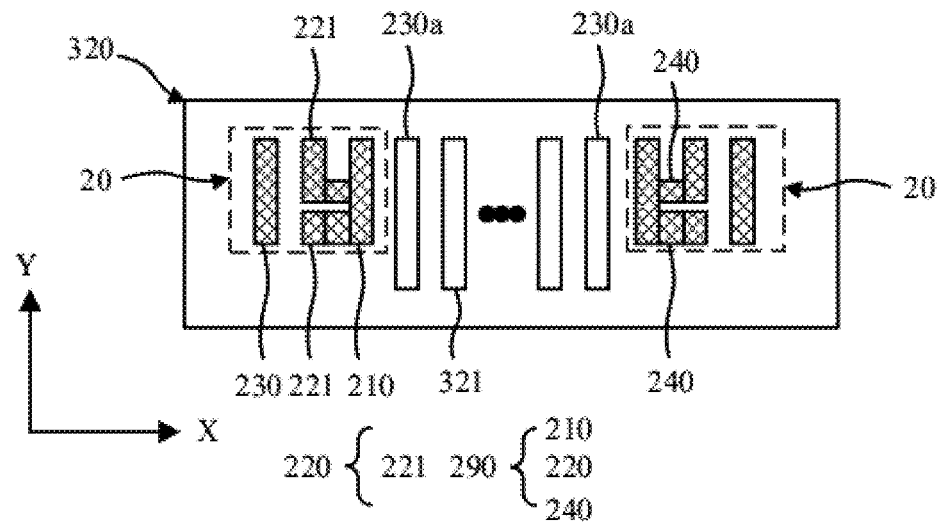
FIG. 3b is a second configuration of a second binding region in a flexible circuit board according to an embodiment of the present disclosure.
Figure 3C:
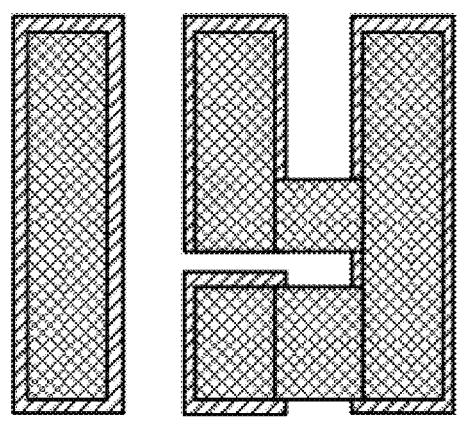
FIG. 3c is a diagram showing a second stack of first and second alignment marks in a display module according to an embodiment of the present disclosure.
Figure 4A:
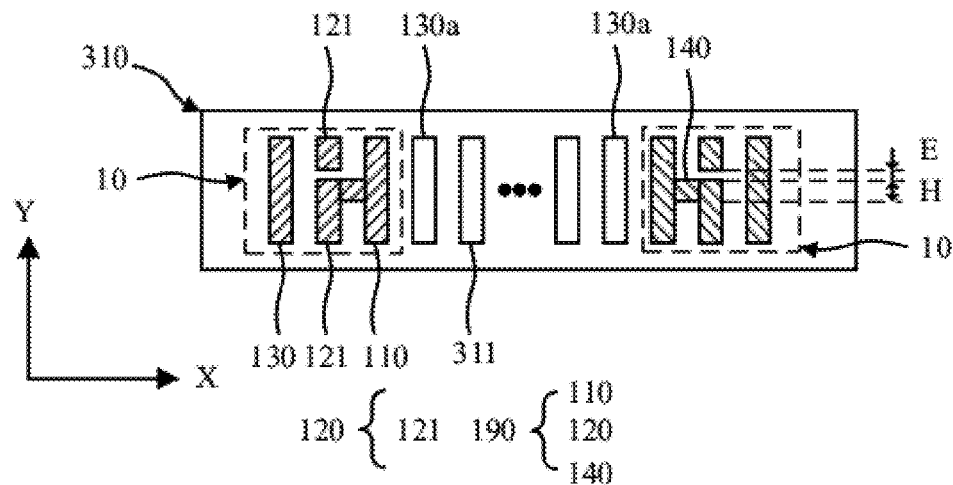
FIG. 4a is a third configuration of a first binding region in a display panel according to an embodiment of the present disclosure.
Figure 4B:
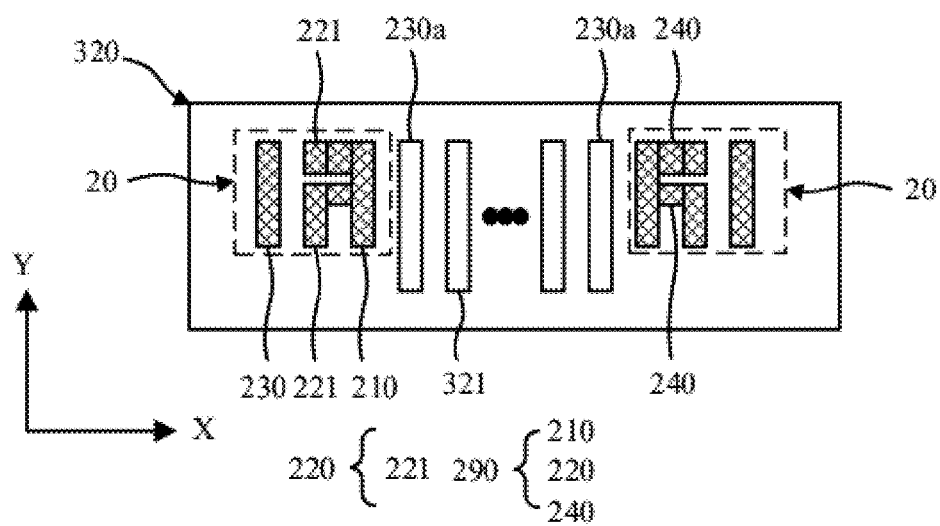
FIG. 4b is a third configuration of a second binding region in a flexible circuit board according to an embodiment of the present disclosure.
Figure 4C:
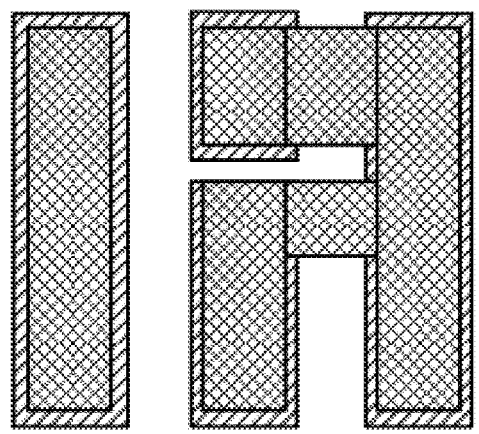
FIG. 4c is a diagram showing a third stack of first and second alignment marks in a display module according to an embodiment of the present disclosure.

The configurations shown in FIGS. 3a to 4c differ in that the longer sub-branch mark of the two first sub-branch marks 121 in FIGS. 3a-3c is disposed on a side of the display region 410 close to the display panel 200 while the longer sub-branch mark of the two first sub-branch marks 121 in FIGS. 4a-4c is disposed on a side of the display region 410 away from the display panel 200.

In the display module 100 of the embodiment of the present disclosure, referring to FIGS. 5a to 6c, the pattern of the first alignment portion 190 and the pattern of the second alignment portion 290 may be the same, and the area of the first extension segment 140 is larger than the area of the second extension segment 240.

Figure 5A:
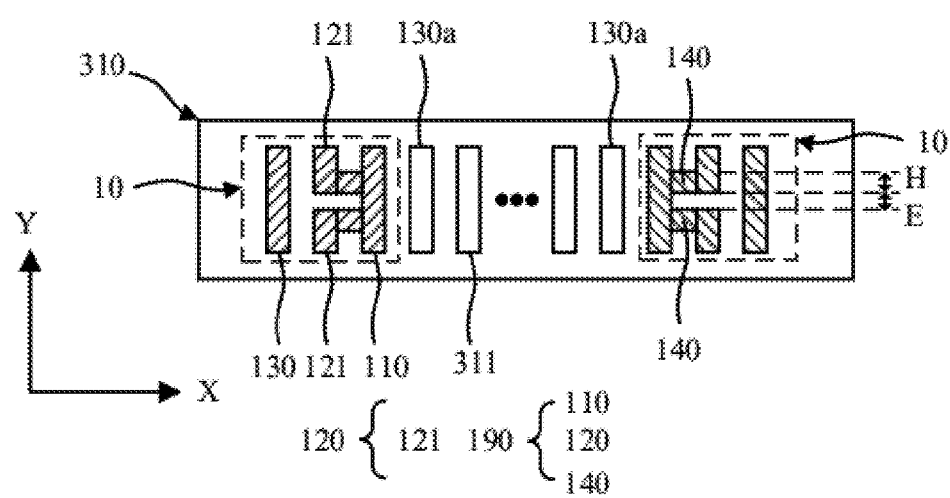
FIG. 5a is a fourth configuration of a first binding region in a display panel according to an embodiment of the present disclosure.
Figure 6A:
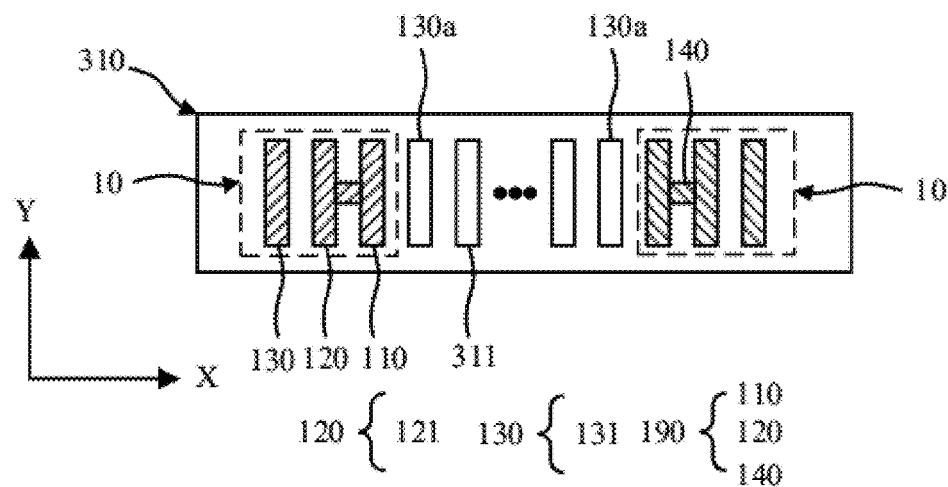
FIG. 6a is a fifth configuration of a first binding region in a display panel according to an embodiment of the present disclosure.
Figure 6B:
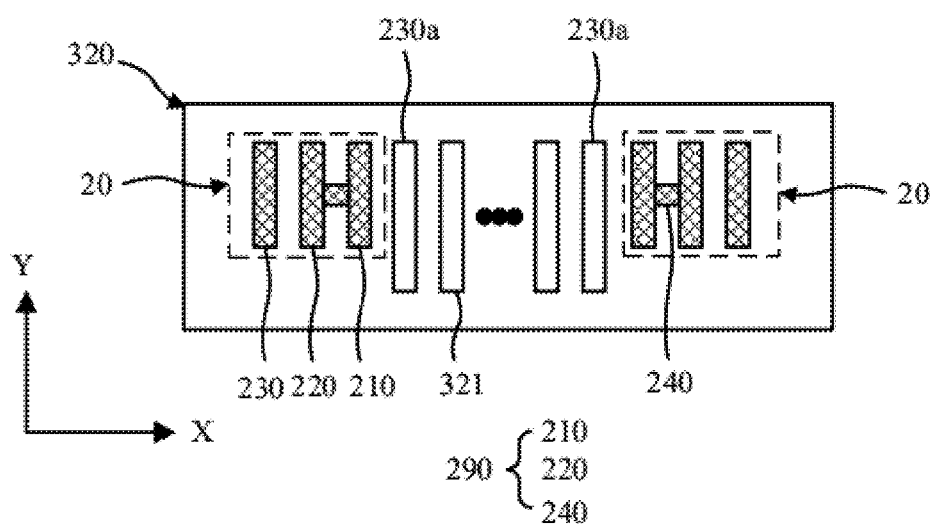
FIG. 6b is a fifth configuration of a second binding region in a flexible circuit board according to an embodiment of the present disclosure.
Figure 6C:
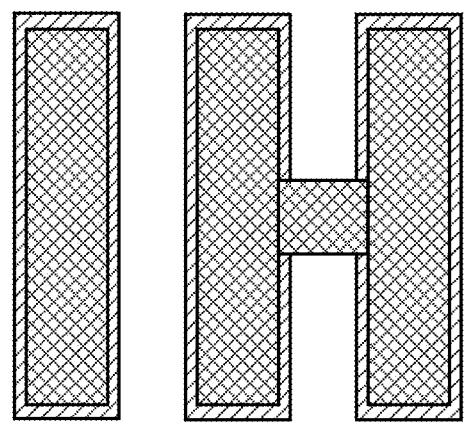
FIG. 6c is a diagram showing a fifth stack of first and second alignment marks in a display module according to an embodiment of the present disclosure.

In the configurations of FIGS. 5a and 6c, since the pattern of the first alignment portion 190 and the pattern of the second alignment portion 290 are the same, the number and shape of the first extension segment 140 are same as those of the second extension segment 240. In order to ensure the accuracy of the alignment, the size of the alignment marks on the display panel 200 needs to be larger than the size of the alignment marks on the flexible circuit board 300, and the area of the first extension segment 140 needs to be larger than the area of the second extension segment 240.

Figure 5B:
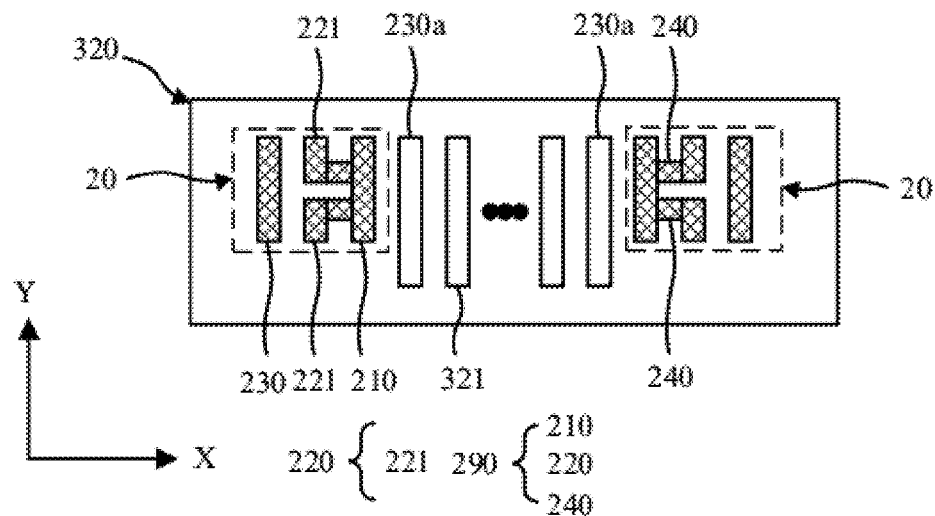
FIG. 5b is a fourth configuration of a second binding region in a flexible circuit board according to an embodiment of the present disclosure.
Figure 5C:
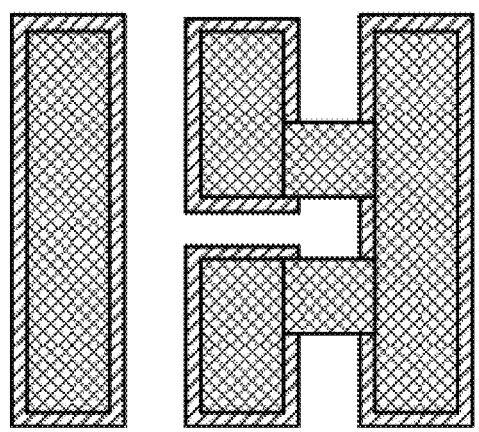
FIG. 5c is a diagram showing a fourth stack of first and second alignment marks in a display module according to an embodiment of the present disclosure.

In the configuration of FIGS. 5a to 5c, the first branch mark 120 includes separately disposed two first sub-branch marks 121 having the same length, and the first stem mark 110 is connected to the corresponding two first sub-branch marks 121 by the two first extension segments 140. Similarly, the second branch mark 220 includes separately disposed two second sub-branch marks 221 having the same length, and the second stem mark 210 is connected to the corresponding two second sub-branch marks 221 by the two second extension segments 240.

In the present embodiment, both the first support portion 130 and the second support portion 230 are extended in the second direction Y in FIGS. 5a-5c. Meanwhile, in FIGS. 5a to 6c, the first support portion 130 and the first stem mark 110 are symmetrically disposed with respect to the center line of the first branch mark 120 in the second direction Y, and in FIGS. 5a to 6c, the second support portion 230 and the second stem mark 210 are symmetrically disposed with respect to the center line of the second branch mark 220 in the second direction Y.

In the configuration of FIGS. 6a-6c, all of the stem mark, the branch mark, and the support portion in the first alignment mark 10 have the same shape and size, all of the stem mark, the branch mark, and the support portion in the second alignment mark 20 have the same shape and size, and each of the stem marks is connected to the corresponding branch mark by an extension segment so that the stem mark and the branch mark constitute an H-shaped mark.

In the embodiment, the size limitation of each of the marks in FIGS. 3a to 6c can be designed with reference to the size in FIGS. 2a-2c, and is not limited in the embodiments of the present disclosure.

In the embodiments of FIGS. 2a to 6c, by providing the first alignment marks 10 and the second alignment marks 20 including at least the stem marks, the branch marks, and the support portions, the present disclosure increases the complexity of the alignment marks, improves the identification accuracy by a mark identification machine, also increases the alignment area of the alignment marks in the display panel 200 and the flexible circuit board 300, thereby avoiding the problem of the uneven stress due to the small number of alignment marks and the small alignment area, and improving the alignment stability of the display panel 200 and the flexible circuit board 300.

In the display module 100 of the embodiment of the present disclosure, a pitch of adjacent two first marks is equal to a pitch of adjacent two first binding terminals 311, and a pitch of adjacent two second marks is equal to a pitch of adjacent two second binding terminals 321.

In the embodiment, the first alignment marks 10 and the first binding terminals 311 are prepared from the same metal material in a same mask process. The first pitch among the stem mark, the branch mark, and the support portion in the first alignment mark 10 is S1. If the first pitch of S1 is smaller than a pitch between two adjacent one of the first binding terminals 311, the accuracy of an exposure process in the terminal region is increased, and thus the corresponding production cost is increased. If the first pitch of S1 is larger than a pitch between two adjacent one of the first binding terminals 311, a wiring area of the terminal region may be wasted. Therefore, the first pitch of S1 and the pitch between two adjacent one of the first binding terminals 311 are equal, and a proper arrangement of the alignment marks can be realized with the original exposure accuracy.

Similarly, the second registration mark 20 and the second binding terminal 321 are prepared from the same metal material in a same mask process. The second pitch among the stem mark, the branch mark, and the support portion in the second alignment mark 20 is S2. A difference between the second pitch and a pitch between the two adjacent second binding terminals 321 also causes the above problem.

In the embodiment, the value of S1 may be 60 microns to 120 microns. For example, the value of S1 in the present disclosure may be 80 microns to 120 microns.

In the above-described embodiment, referring to FIGS. 3a to 5c, for the first alignment mark 10, a size H of the first extension segment 140 in the second direction Y may be greater than or equal to 80 microns. For example, the size H of the present disclosure may be 80 microns to 100 microns.

A size E of adjacent two first sub-branch marks 121 in the second direction Y may be 50 microns to 80 microns. Similarly, for the second alignment mark 20, it is sufficient to be integrally retracted 5 μm on the first alignment mark 10.

In the display module 100 of the embodiment of the present disclosure, the size of the first stem mark 110 in the second direction Y is equal to the size of the first binding terminal 311 in the second direction Y.

In the embodiment, since the alignment marks are all prepared from a metal material, the first stem mark 110 can also be used as a dummy terminal in the terminal region in the case that the first stem mark 110 is used as the alignment mark. Therefore, an internal terminal can be protected from being eroded by the peripheral water vapor. The first stem mark 110 can also be used as a backup terminal to avoid failure of a signal input due to an abnormality of a binding terminal during a test or the like.

In the display module 100 of the embodiment of the present disclosure, referring to FIGS. 2a to 6c, the plurality of first binding terminals 311 further include a third support portion 130a disposed immediately adjacent to the first stem mark 110 in the first alignment portion 190; the plurality of second binding terminals 321 further include a fourth support portion 230a disposed immediately adjacent to the second stem mark 210 in the second alignment portion 290; and the third support portion 130a is aligned and fitted to the fourth support portion 230a.

In the embodiment, in order to avoid interference between the alignment portion and the binding terminal, the present disclosure sets the binding terminal adjacent to the alignment mark as a corresponding support portion such that the first alignment portion 190 is disposed between the first support portion 130 and the third support portion 130a, and the second alignment portion 290 is disposed between the second support portion 230 and the fourth support portion 230a. The arrangement of the third support portion 130a and the fourth support portion 230a further reduces the alignment pressure between the first alignment portion 190 and the second alignment portion 290. Meanwhile, diffusion of adhesive layers of the first and second alignment portions 190 and 290 toward the plurality of binding terminals can be also avoided.

Figure 7:
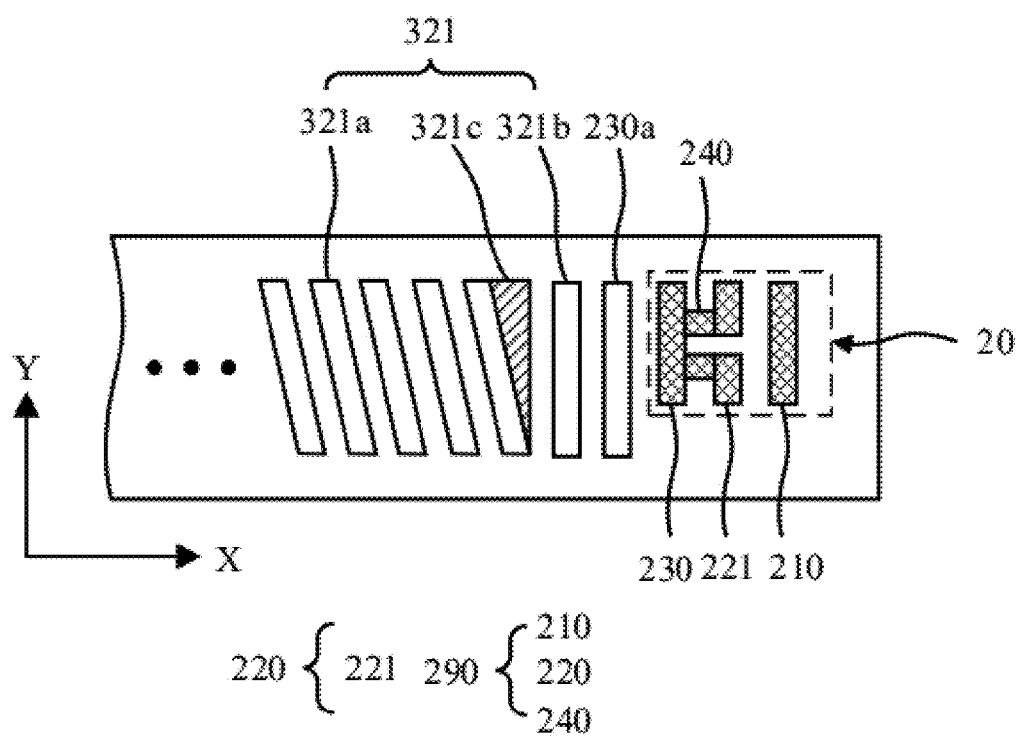
FIG. 7 is a sixth configuration of a second binding region in a flexible circuit board according to an embodiment of the present disclosure.

In the display module 100 of the embodiment of the present application, referring to FIG. 7, a plurality of second binding terminals 321 may include a plurality of first angle terminals 321a and a plurality of second angle terminals 321b arranged continuously, and the first angle terminals 321a and the second angle terminals 321b are arranged at an included angle. The plurality of second binding terminals 321 further include a spacing mark 321c between the plurality of first angle terminals 321a and the plurality of second angle terminals 321b.

In the embodiment, the spacing mark 321c has a right angled triangle of which the hypotenuse is parallel to an oblique direction of the first angle terminal 321 and of which the long cathetus is parallel to an oblique direction of the second angle terminal 321b.

In the embodiment, in the flexible circuit board, a plurality of first angle terminals 321a and a plurality of second angle terminals 321b are provided on the flexible circuit board according to the arrangement requirements of the binding terminals, the plurality of first angle terminals 321a may be arranged at a first angle, and the plurality of second angle terminals 321b may be arranged at a second angle. However, since the first angle terminal 321a and the second angle terminal 321b are arranged at an included angle, when the first angle terminal 321a and the second angle terminal 321b are designed, a pitch between the first angle terminal 321a and the second angle terminal 321b is not well controlled. If the pitch between the first angle terminal 321a and the second angle terminal 321b is too small, the shorting of the first angle terminal 321a and the second angle terminal 321b may be caused. If the pitch between the first angle terminal 321a and the second angle terminal 321b is too large, the arrangement of the first angle terminal 321a and the second angle terminal 321b may be too dense. Accordingly, the arrangement of the spacing mark 321c of the present disclosure may serve as a buffer for the first angle terminal 321a and the second angle terminal 321b, and the pitch between the spacing mark 321c and the second angle terminal 321b can be equal to the pitch between two adjacent second angle terminals 321b.

Figure 8:
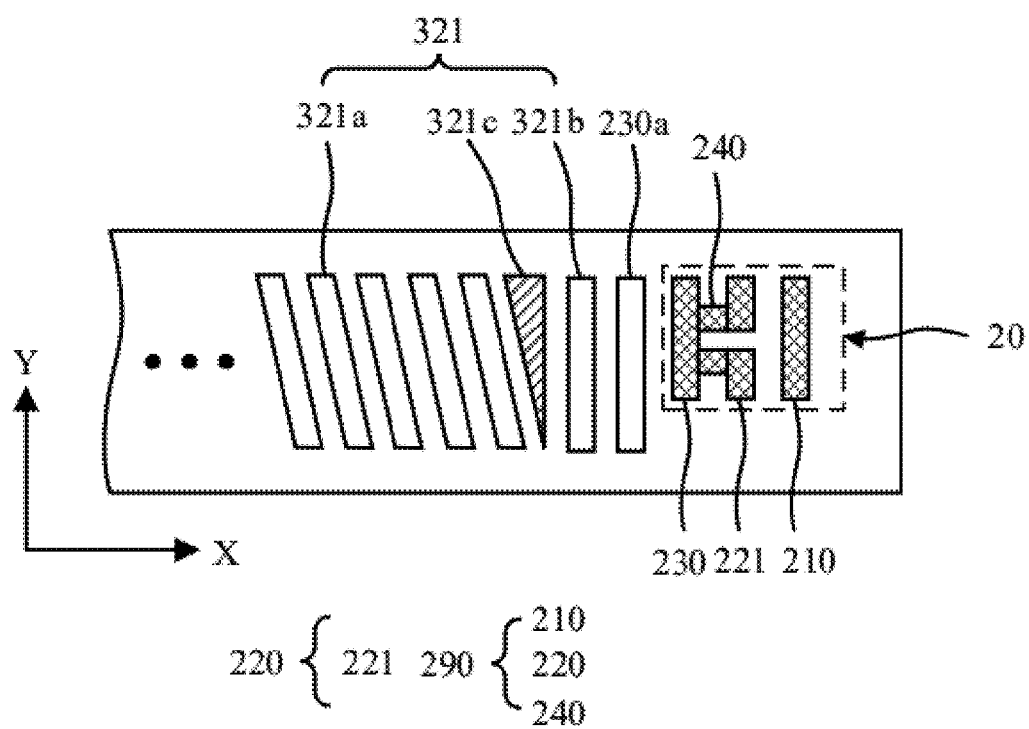
FIG. 8 is a seventh configuration of a second binding region in a flexible circuit board according to an embodiment of the present disclosure.

In the embodiment, as shown in FIG. 7, the spacing mark 321c is separately disposed from the adjacent first angle terminal 321a and second angle terminal 321b. Alternatively, as shown in FIG. 8, the spacing mark 321c is bound to the adjacent first angle terminal 321a, and the spacing mark 321c is separately disposed from the adjacent second angle terminal 321b.

In the embodiment, since the binding region of the flexible circuit board 300 is aligned and bound to the binding region of the display panel 200, the binding region of the display panel 200 is also provided with a binding terminal that is aligned and bound to the first angle terminal 321a and the second angle terminal 321b.

In the embodiment, the binding region of the display panel 200 may also be provided with a spacing mark 321c aligned to that of the flexible circuit board 300.

Figure 9:
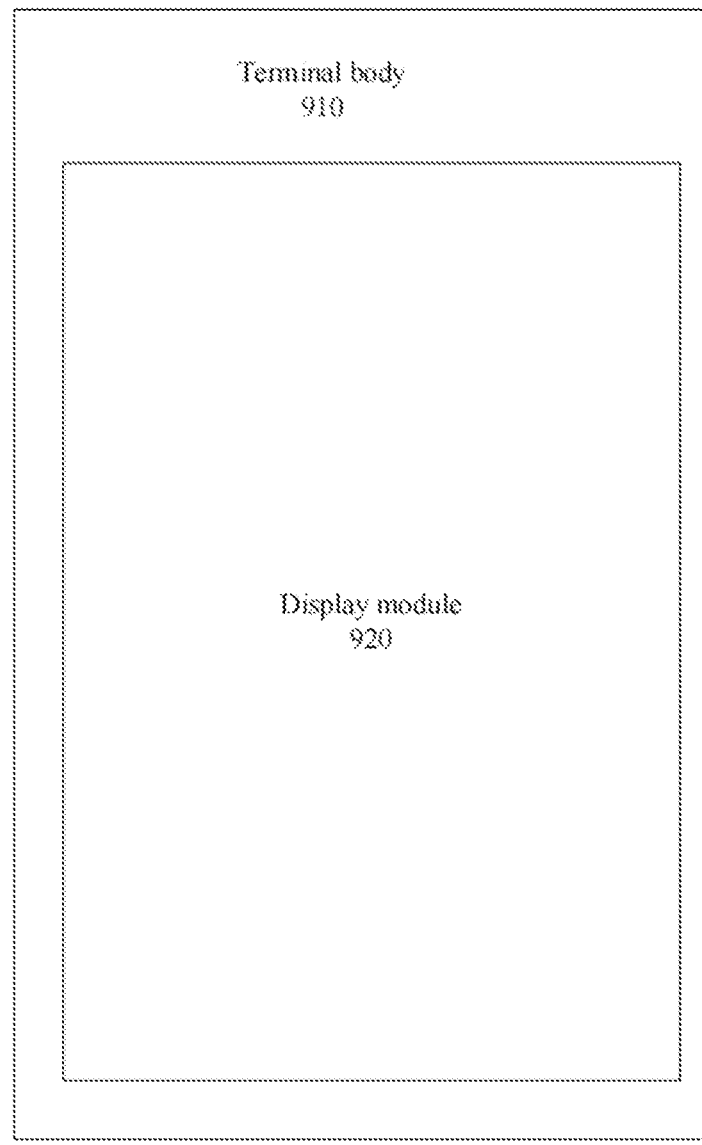
FIG. 9 is a schematic structural diagram of a mobile terminal according to an embodiment of the present disclosure.

FIG. 9 is a schematic structural diagram of a mobile terminal 900 according to an embodiment of the present disclosure. The mobile terminal 900 includes a terminal body 910, and a display module 920 being any one of the display modules as described above. The terminal body 910 and the display module 920 are combined integrally. The terminal body 910 may be, but not limited to, a housing, a power supply, or other external driver or the like. The mobile terminal 900 may be an electronic device such as a mobile phone, a television, a notebook computer, or the like.

It can be understood that, for those ordinary skilled in the art, equivalent replacements or changes can be made according to the technical solutions and inventive concepts of the present disclosure, and all such changes or replacements should fall within the protection scope of the claims appended to the present disclosure.

What is claimed is:

1. A display module, comprising:
a display panel comprising a plurality of first binding terminals and a plurality of first alignment marks located at periphery of the plurality of first binding terminals; and
a flexible circuit board comprising a plurality of second binding terminals and a plurality of second alignment marks located at periphery of the plurality of second binding terminals, wherein the plurality of second binding terminals are bound to the plurality of first binding terminals, each of the first alignment marks corresponds to one of the second alignment marks, and the number of the first alignment marks is equal to the number of the second alignment marks;
wherein, each of the first alignment marks comprises a plurality of first marks, each of the second alignment marks comprises a plurality of second marks, each of the first marks corresponds to one of the second marks, the plurality of first marks comprise a first alignment portion and a first support portion, and the first alignment portion is located between the first support portion and the plurality of first binding terminals;
wherein, the plurality of second marks comprise a second alignment portion and a second support portion, and the second alignment portion is located between the second support portion and the plurality of second binding terminals; and
wherein the first support portion and the second support portion are aligned and fitted to each other, and the first alignment portion and the second alignment portion are aligned and fitted to each other;
wherein the first alignment portion comprises a first stem mark and a first branch mark juxtaposed in a first direction, and the second alignment portion comprises a second stem mark and a second branch mark juxtaposed in the first direction, wherein the first stem mark corresponds to the second stem mark, the first branch mark corresponds to the second branch mark, and the first direction is parallel to an arrangement direction of the plurality of the first binding terminals or the plurality of the second binding terminals;
wherein the first alignment portion further comprises at least one first extension segment extending toward the first branch mark, the second alignment portion further comprises at least one second extension segment extending toward the second branch mark, and an area of the first extension segment is different from an area of the second extension segment;
wherein the first support portion is arranged in the first direction, and the first support portion and the first stem mark are symmetrically disposed with respect to a center line of the first branch mark in the second direction;
wherein the second support portion is arranged in the first direction, and the second support portion and the second stem mark are symmetrically disposed with respect to a center line of the second branch mark in the second direction; and
wherein the second direction is perpendicular to the first direction.

2. The display module of claim 1, wherein, a pattern of the first alignment portion is different from a pattern of the second alignment portion, and the area of the first extension segment is smaller than the area of the second extension segment.

3. The display module of claim 2, wherein, the first extension segment is separately disposed from the first branch mark, and an extension length of the first extension segment in the first direction is equal to a length of the first stem mark in the first direction.

4. The display module of claim 3, wherein, the second branch mark comprises separately disposed two second sub-branch marks, and the second stem mark comprises three second extension segments extending toward the second branch mark; one of the second extension segments in the middle of the three second extension segments is aligned to the first extension segment and extended toward a region between the two second sub-branch marks; and two of the second extension segments on both sides of the three second extension segments are extended toward the corresponding second sub-branch mark, and are connected to the corresponding second sub-branch mark; and
wherein, sizes of the two second extension segments on both sides of the three second extension segments in the second direction Y are equal to a size of the corresponding second sub-branch mark in the second direction Y.

5. The display module of claim 2, wherein, the first branch mark comprises separately disposed two first sub-branch marks, the first stem mark is connected to one of the two first sub-branch marks by the first extension segment, and the first stem mark is separately disposed from another of the two first sub-branch marks; and the second branch mark comprises separately disposed two second sub-branch marks, and the second stem mark is connected to the two first sub-branch marks by the two extension segments; a size of one of the two second extension segments in the second direction is equal to a size of the second stem mark in the first direction, a size of another of the two second extension segments in the second direction is equal to a size of the corresponding second sub-branch mark in the second direction, and the first direction is perpendicular to the second direction.

6. The display module of claim 1, wherein, a pattern of the first alignment portion is the same as a pattern of the second alignment portion, and the area of the first extension segment is larger than the area of the second extension segment.

7. The display module of claim 1, wherein, the plurality of first binding terminals further comprise a third support portion disposed immediately adjacent to the first stem mark in the first alignment portion; and the plurality of second binding terminals further comprise a fourth support portion disposed immediately adjacent to the second stem mark in the second alignment portion; and wherein the third support portion is aligned and fitted to the fourth support portion.

8. The display module of claim 1, wherein a size of the first stem mark in the second direction is equal to a size of each of the first binding terminals in the second direction.

9. The display module of claim 1, wherein the plurality of second binding terminals comprise a plurality of first angle terminals and a plurality of second angle terminals arranged continuously, and the first angle terminal and the second angle terminal are arranged at an included angle; and wherein, the plurality of second binding terminals further comprise a spacing mark between the plurality of first angle terminals and the plurality of second angle terminals.

10. The display module of claim 9, wherein the spacing mark is separately disposed from the first angle terminals and second angle terminals adjacent to the spacing mark.

11. The display module of claim 1, wherein a pitch of adjacent two of the first marks is a first pitch, and a pitch of adjacent two of the second marks is a second pitch;

wherein, the first pitch is smaller than the second pitch, and a difference between the first pitch and the second pitch is 9 to 11 microns.

12. The display module of claim 11, wherein a pitch of adjacent two of the first marks is equal to a pitch of adjacent two of the first binding terminals, and a pitch of adjacent two of the second marks is equal to a pitch of adjacent two of the second binding terminals.

13. The display module of claim 1, wherein an orthographic projection of a portion of the second marks on the first marks is within the first marks.

14. A mobile terminal comprising a terminal body and a display module, wherein the display module and the terminal body are combined integrally; wherein the display module comprises:

a display panel comprising a plurality of first binding terminals and a plurality of first alignment marks located at periphery of the plurality of first binding terminals; and a flexible circuit board comprising a plurality of second binding terminals and a plurality of second alignment marks located at periphery of the plurality of second binding terminals, wherein the plurality of second binding terminals are bound to the plurality of first binding terminals, each of the first alignment marks corresponds to one of the second alignment marks, and the number of the first alignment marks is equal to the number of the second alignment marks;

wherein, each of the first alignment marks comprises a plurality of first marks, each of the second alignment marks comprises a plurality of second marks, each of the first marks corresponds to one of the second marks, the plurality of first marks comprise a first alignment portion and a first support portion, and the first alignment portion is located between the first support portion and the plurality of first binding terminals;

wherein, the plurality of second marks comprise a second alignment portion and a second support portion, and the second alignment portion is located between the second support portion and the plurality of second binding terminals; and wherein the first support portion and the second support portion are aligned and fitted to each other, and the first alignment portion and the second alignment portion are aligned and fitted to each other;

wherein the first support portion is arranged in the first direction, and the first support portion and the first stem mark are symmetrically disposed with respect to a center line of the first branch mark in the second direction;

wherein the second support portion is arranged in the first direction, and the second support portion and the second stem mark are symmetrically disposed with respect to a center line of the second branch mark in the second direction; and wherein the second direction is perpendicular to the first direction.

15. The mobile terminal of claim 14, wherein, the plurality of first binding terminals further comprise a third support portion disposed immediately adjacent to the first stem mark in the first alignment portion; and the plurality of second binding terminals further comprise a fourth support portion disposed immediately adjacent to the second stem mark in the second alignment portion; and wherein the third support portion is aligned and fitted to the fourth support portion.

16. The mobile terminal of claim 15, wherein the plurality of second binding terminals comprise a plurality of first angle terminals and a plurality of second angle terminals arranged continuously, and the first angle terminals and the second angle terminals are arranged at an included angle; and wherein, the plurality of second binding terminals further comprise a spacing mark between the plurality of first angle terminals and the plurality of second angle terminals.

17. The mobile terminal of claim 16, wherein the spacing mark is separately disposed from the first angle terminals and second angle terminals adjacent to the spacing mark.

18. A display module, comprising:
a display panel comprising a plurality of first binding terminals and a plurality of first alignment marks located at periphery of the plurality of first binding terminals; and
a flexible circuit board comprising a plurality of second binding terminals and a plurality of second alignment marks located at periphery of the plurality of second binding terminals, wherein the plurality of second binding terminals are bound to the plurality of first binding terminals, each of the first alignment marks corresponds to one of the second alignment marks, and the number of the first alignment marks is equal to the number of the second alignment marks;
wherein, each of the first alignment marks comprises a plurality of first marks, each of the second alignment marks comprises a plurality of second marks, each of the first marks corresponds to one of the second marks, the plurality of first marks comprise a first alignment portion and a first support portion, and the first alignment portion is located between the first support portion and the plurality of first binding terminals;
wherein, the plurality of second marks comprise a second alignment portion and a second support portion, and the second alignment portion is located between the second support portion and the plurality of second binding terminals; and
wherein the first support portion and the second support portion are aligned and fitted to each other, and the first alignment portion and the second alignment portion are aligned and fitted to each other;
wherein the first alignment portion comprises a first stem mark and a first branch mark juxtaposed in a first direction, and the second alignment portion comprises a second stem mark and a second branch mark juxtaposed in the first direction, wherein the first stem mark corresponds to the second stem mark, the first branch mark corresponds to the second branch mark, and the first direction is parallel to an arrangement direction of the plurality of the first binding terminals or the plurality of the second binding terminals;
wherein the first alignment portion further comprises at least one first extension segment extending toward the first branch mark, the second alignment portion further comprises at least one second extension segment extending toward the second branch mark, and an area of the first extension segment is different from an area of the second extension segment;
wherein a pattern of the first alignment portion is different from a pattern of the second alignment portion, and the area of the first extension segment is smaller than the area of the second extension segment;
wherein the first branch mark comprises separately disposed two first sub-branch marks, the first stem mark is connected to one of the two first sub-branch marks by the first extension segment, and the first stem mark is separately disposed from another of the two first sub-branch marks; and
wherein the second branch mark comprises separately disposed two second sub-branch marks, and the second stem mark is connected to the two first sub-branch marks by the two extension segments; a size of one of the two second extension segments in the second direction is equal to a size of the second stem mark in the first direction, a size of another of the two second extension segments in the second direction is equal to a size of the corresponding second sub-branch mark in the second direction, and the first direction is perpendicular to the second direction.

\* \* \* \* \*